United States Patent [19]

Mikeska et al.

[11] Patent Number: 5,254,191
[45] Date of Patent: * Oct. 19, 1993

[54] METHOD FOR REDUCING SHRINKAGE DURING FIRING OF CERAMIC BODIES

[75] Inventors: Kurt R. Mikeska, Wilmington; Daniel T. Schaefer, Newark, both of Del.

[73] Assignee: E. I. Du Pont de Nemours and Company, Wilmington, Del.

[*] Notice: The portion of the term of this patent subsequent to Feb. 4, 2009 has been disclaimed.

[21] Appl. No.: 591,192

[22] Filed: Oct. 4, 1990

[51] Int. Cl.$^5$ ............................................. C04B 37/00
[52] U.S. Cl. .................................. 156/89; 156/289; 156/344; 264/58; 264/61; 264/63; 264/297.4; 264/297.9; 264/319
[58] Field of Search ..................... 264/60, 63, 61, 58, 264/297.4, 297.9, 319; 156/89, 289, 344; 427/376.1

[56] References Cited

U.S. PATENT DOCUMENTS 5,035,961  7/1991  Riley ............................ 156/89
5,085,720  2/1992  Mikeska et al. ............... 264/61

FOREIGN PATENT DOCUMENTS 0243858  4/1987  European Pat. Off. .

Primary Examiner—Jan H. Silbaugh
Assistant Examiner—Christopher A. Fiorilla

[57] ABSTRACT

A method for reducing X-Y shrinkage during firing of ceramic bodies in which a flexible constraining layer, which becomes porous during firing, is applied to the ceramic body such that the flexible constraining layer conforms closely to the surface of the unfired ceramic body as the assemblage is fired.

28 Claims, 3 Drawing Sheets

METHOD FOR REDUCING SHRINKAGE DURING FIRING OF CERAMIC BODIES

FIELD OF INVENTION

The invention relates to a method for substantially reducing and controlling planar shrinkage and reducing distortion of ceramic bodies during firing.

BACKGROUND OF THE INVENTION

An interconnect circuit board is the physical realization of electronic circuits or subsystems from a number of extremely small circuit elements electrically and mechanically interconnected. It is frequently desirable to combine these diverse electronic components in an arrangement so that they can be physically isolated and mounted adjacent one another in a single compact package and electrically connected to each other and/or to common connections extending from the package.

Complex electronic circuits generally require that the circuit be constructed of several layers of conductors separated by insulating dielectric layers. The conductive layers are interconnected between levels by electrically conductive pathways through the dielectric called vias.

One well known method for constructing a multilayer circuit is by co-firing a multiplicity of ceramic tape dielectrics on which conductors have been printed with metallized vias extending through the dielectric layers to interconnect the various conductor layers. (See Steinberg, U.S. Pat. No. 4,654,095.) The tape layers are stacked in registry and pressed together at a preselected temperature and pressure to form a monolithic structure which is fired at an elevated temperature to drive off the organic binder, sinter the conductive metal and densify the dielectric. This process has the advantage over classical "thick film" methods since firing need only be performed once, saving fabricating time and labor and limiting the diffusion of mobile metals which can cause shorting between the conductors. However, this process has the disadvantage that the amount of shrinkage which occurs on firing may be difficult to control. This dimensional uncertainty is particularly undesirable in large, complex circuits and can result in misregistration during subsequent assembly operations.

Pressure sintering or hot pressing, the firing of a ceramic body with an externally applied load or weight, is a well known method for both reducing the porosity of and controlling the shape (dimensions) of ceramic parts. (See Takeda et al., U.S. Pat. No. 4,585,706; Kingery et al., *Introduction to Ceramics*, p 502–503, Wiley, 1976.) Pressure sintering of ceramic circuits in simple molds is made difficult by the tendency for the part to adhere to the mold and/or for cross contamination to occur between the part and the mold. Further, application of a load or similar constraining force to the surface of a ceramic part during burnout of the organic binder may restrict the escape of volatiles, causing incomplete burnout and/or distortion.

Copending U.S. application, Ser. No. 07/466,934, discloses a method for constrained sintering that permits escape of volatiles during burnout of the organic binder. A release layer is applied to the surface of the unfired ceramic body. A weight is subsequently placed on the release layer to reduce shrinkage in the X-Y direction. The release layer between the weight and ceramic body provides pathways for the volatiles to escape. If a method were established whereby ceramic circuits could be constrained-sintered without need for a mold, without applying external loads, and without restricting the escape of volatiles during burnout, and yet still largely eliminate dimensional uncertainty in the final circuit, processing steps associated with firing the circuitry with reduced shrinkage could be simplified or eliminated. The advantage would be greater yet if the method would permit co-firing of conductive metallic pathways on the outer surfaces of the ceramic circuit.

Flaitz et al. (European Patent Application 0 243 858) describe three approaches to circumventing the aforementioned difficulties. With the first approach, constraint is applied only to the outer edges (periphery) of the part, providing an open escape path for volatiles and an entry path for oxygen. With the second approach, a co-extensive force is applied to the entire surface of the piece to be sintered by either using co-extensive porous platens or by application of an air-bearing force to the surface or surfaces of the piece to be sintered. With the third approach, a frictional force is applied to the sintering body by use of contact sheets comprised of a porous composition which does not sinter or shrink during the heating cycle and which prohibit any shrinkage of the substrate. The composition of the contact sheets is selected so that they remain porous during firing, do not fuse to the ceramic, are thermally stable so that they will not shrink or expand during the sintering cycle, and have continuous mechanical integrity/rigidity. The contact sheets maintain their dimensions during the sintering cycle, thus restricting the ceramic part from shrinking. After lamination of the contact sheets to the article to be sintered, sintering takes place without use of additional weights.

SUMMARY OF THE INVENTION

In its primary aspect, the invention is directed to a method for substantially reducing X-Y shrinkage during firing of ceramic bodies comprising the sequential steps of a. Providing an unfired ceramic body comprising an admixture of finely divided particles of ceramic solids and sinterable inorganic binder dispersed in a volatilizable solid polymeric binder;

b. Applying to a surface of the unfired ceramic body a flexible constraining layer such that the constraining layer conforms closely to the surface of the unfired ceramic body, the flexible constraining layer comprising finely divided particles of nonmetallic inorganic solids dispersed in a volatilizable polymeric binder, the Penetration of the sinterable inorganic binder into the constraining layer being no more than 50 $\mu$m;

c. Firing the assemblage at a temperature and for a time sufficient to effect volatilization of the polymeric binders from both the ceramic body and the constraining layer, forming interconnected porosity in the constraining layer and sintering of the inorganic binder in the ceramic body without incurring radial bulk flow of the sintered body;

d. Cooling the fired assemblage; and e. Removing the porous constraining layer from the surface of the sintered ceramic body.

In a second aspect, the invention is directed to a composite unfired ceramic body comprising an admixture of finely divided particles of ceramic solids and sinterable inorganic binder dispersed in a volatilizable solid polymeric binder having affixed and closely conformed to a surface thereof a constraining layer comprising finely divided particles of non-metallic inorganic solids dispersed in a volatilizable solid polymeric binder.

In a still further aspect, the invention is directed to a method for making the composite unfired ceramic tape comprising the sequential steps of applying to at least one surface of an unfired ceramic tape a constraining layer comprising finely divided particles of non-metallic inorganic solids dispersed in a volatilizable organic medium comprising solid polymeric binder dissolved in a volatile organic solvent, and removing the organic solvent by evaporation.

PRIOR ART

EPO 87 105 868.1, Flaitz et al.

The patent is directed to a constrained sintering method which uses a restraining force in the Z-direction to prohibit X-Y distortion, camber and shrinkage during firing of a ceramic MLC substrate. Prior to firing, porous, rigid unfired ceramic, thermally stable contact sheets are laminated to the surfaces of the ceramic article in order physically to restrict the ceramic from shrinking without the application of additional pressure. The contact sheets maintain their mechanical integrity and dimensional stability throughout the sintering cycle and the fired sheets are removed from the substrate surface by polishing or scraping. U.S. Pat. No. 4,521,449, Arnold et al.

The patent teaches the use of a dielectric layer of ceramic material to facilitate sintering green ceramic sheets that contain surface vias and pad areas that are joined by indented lines and filled with a conductive metal paste. After firing, the components are coated with a suitable metal to make them solder-wettable for lead attachment. The inventors recognize the need for post-metallization to accommodate the significant (17%) substrate shrinkage and distortion that is typical for fired ceramic material.

U.S. Pat. No. 4,340,436, Dubetsky et al.

The patent discloses superimposing an inert, coextensive nonadherent, removable, light weight, planar platen onto a green glass ceramic laminate to restrict lateral X-Y shrinkage and distortion when the glass has reached coalescent temperature during firing. The inventors reported that platen pressures of about 0.012 to about 0.058 lbs/in$^2$ over the laminate produced enhanced planarity and lateral dimensional integrity.

BRIEF DESCRIPTION OF THE DRAWING

The Drawing consists of six FIGURES.

DETAILED DESCRIPTION OF THE INVENTION

General

Figure 1:
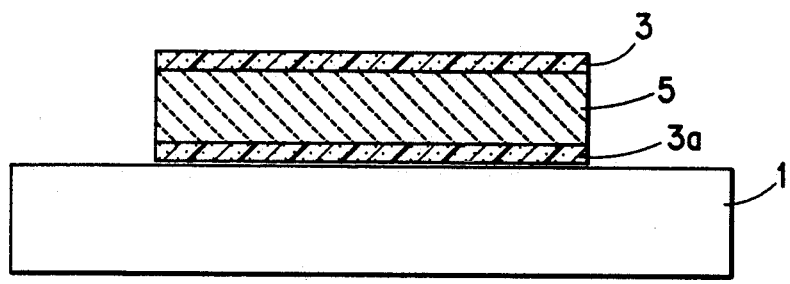
FIG. 1 is a schematic representation of the arrangement of the various components of the invention prior to firing in which a constraining layer is affixed to both sides of a substrate.

The general purpose of the invention is to provide a new and improved method for reducing X-Y shrinkage during the firing of ceramic bodies. A preferred application of the invention is for fabricating ceramic multilayer circuits using conventional conductive metallizations, including conductors, resistors and the like, and dielectric tapes in such a manner that the circuit feature dimensions established during via punching and printing are substantially maintained during firing. The method of the invention is therefore more economical in by-passing many of the sources of dimensional uncertainty in ceramic parts and by eliminating many of the circuit development and manufacturing steps necessary to avoid dimensional errors and misregistration.

During the firing cycle, after volatilization of the organic binders, the inorganic components of the tape undergo sintering when heated to a sufficient temperature. During sintering, the particulate-porous tape undergoes changes in its structure which are common to porous fine-grained crystalline and non crystalline materials. There is an increase in grain size, there is a change in pore shape, and there is change in pore size and number. Sintering usually produces a decrease in porosity and results in densification of the particulate compact.

Central to the invention is the use of a flexible ceramic constraining layer which is applied to the surface(s) of the ceramic circuit layers. The constraining layer serves several functions: (1) it provides a uniform high friction contact layer which substantially reduces shrinkage in the plane of the sintering part; and (2) it provides an escape pathway for the volatile components of the ceramic tape prior to sintering. In certain cases, it facilitates co-firing of top surface metallization without incurring damage thereto.

In order for the constraining layer to effectively reduce shrinkage in the plane of the sintering part, it is applied as a flexible layer to the surface(s) of the unfired ceramic circuit layer(s). The flexibility of the constraining layer enables the layer to conform closely to the topography of the unfired ceramic surface(s). Lamination of the flexible constraining layer to the unfired ceramic surface(s) may be used to force the constraining layer into even closer conformance, depending upon the mode of application of the constraining layer. For example, the constraining layer may be spray coated, dip-coated or rolled onto the unfired ceramic in the form of a dispersion, or it may be formulated as a flexible sheet and laminated onto the unfired ceramic. Lamination is particularly effective in reducing the size of any gaps (flaws) between a constraining layer and surface(s) of ceramic body.

Close conformance of the constraining layer to the ceramic part is necessary to prevent the constraining layer from delaminating and buckling away the from the ceramic part during sintering. During firing, as the dielectric substrate begins to shrink, the constraining layer is put into biaxial compression by the in-plane sintering strain of the dielectric part. If the compressive stress in the constraining layer reaches a critical point, the constraining layer delaminates and buckles away from the sintering dielectric substrate. The buckling problem germane to the invention can be examined by analyzing elastic laminated plates and shells after partial debonding that are subjected to compressive loads parallel to the laminated layers. Buckling has been analyzed extensively in S. P. Timoshenko and G. M. Geere, Theory of Elastic Stability, 2nd Edn., McGraw Hill, New York (1961). Specific problems of buckling in compressed films have been analyzed in A. G. Evans and J. W. Hutchinson, On the Mechanics of Delamination and Spalling in Compressed Films, Int. J. Solids Structures, Vol. 20, No. 5, pp. 455-466, (1984).

Figure 4:
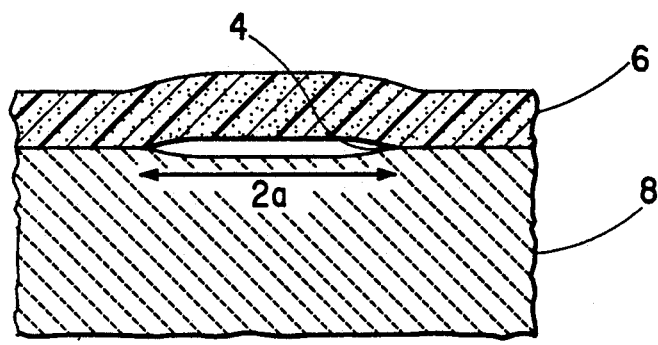
FIG. 4 is a schematic representation of delamination at the ceramic/constraining layer interface without buckling of the constraining layer.
Figure 5:
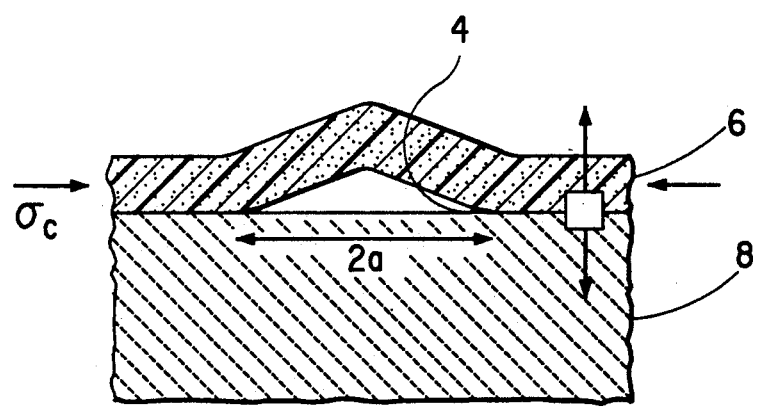
FIG. 5 is a schematic representation of delamination at the ceramic/constraining layer interface with buckling of the constraining layer.

The buckling problem can be solved for one dimension (beam), two dimensions (rectangular or square geometry), and for a circular geometry. A circular geometry is the most appropriate for the instant configuration and is presented here. The problem concerns a single interface crack or flaw 4 parallel to the free surfaces 6 and 8 as shown in FIG. 4. The flaw is represented by a circular delamination of radius, a, which is in biaxial compression $\sigma_o$. If the crack or flaw is of sufficient size, the film 6 above the crack is susceptible to buckling. An interfacial flaw or delamination parallel to the free surface does not disturb the stress field since the stress field also acts parallel to the surface. Thus, a stress concentration at the flaw or crack edge is not induced. If the film 6 buckles away from the substrate 8 as shown in FIG. 5, the separation redistributes (i.e. concentrates) the stress at the perimeter of the interface crack which induces crack extension and failure by buckling. Conditions at the interface crack involve a combination of opening (Mode I) and shearing (Mode II) stresses. In our situation, where the film is a compressed powder, once buckling occurs, the shear forces at the crack tip will easily cause the powder film to fail since the powder is very weak in shear and tension.

The film (constraining layer) will undergo buckling if the compressive stress exceeds the critical buckling stress for the film. The appropriate circular solution for the present case assumes fixed or clamped film edges. The critical buckling stress, $\sigma_o$, is expressed as $$\sigma_c = \left[ \frac{kE}{12(1 - v^2)} \right] \left( \frac{t}{a} \right)^2 \quad (1)$$

where t is the thickness of the constraining layer, a is the radius of the crack or flaw, k=14.68 for a clamped edge (k is a numerical factor determined from the Bessel function used to solve the initial differential equation appropriate for the circular geometry), E is the Young's Modulus of the constraining layer and v is Poisson's ratio. Equation (1) shows that buckling will occur during the process if a crack or flaw of a critical size is present at the interface between the constraining layer and the part being sintered. Equation (1) also shows that the thickness t and Modulus E of the constraining layer are important in determining the critical buckling stress.

In practice, flaws can be generated during the application of the constraining layer to the ceramic body substrate and during heat-up. If the constraining layer is not flexible enough to conform closely to the topography of the ceramic circuit layer(s), or if application methods are not optimized to ensure close conformance of the constraining layer to the topography of the ceramic circuit layer(s), then a flaw or crack may be created at the constraining layer/ceramic circuit interface. During heat-up, flaws can be generated by thermal expansion mismatches between the constraining layer and the ceramic circuit substrate. Thermal expansion flaws that are not parallel to the constraining layer/substrate interface act as additional stress concentrators. Thermal expansion effects (cracking, etc.) can sometimes be eliminated or reduced by using a constraining layer which has a coefficient of thermal expansion higher than the substrate, thus, putting the constraining layer in planar compression during heat-up.

In order to facilitate removal of the constraining layer after firing, the glass from the ceramic part which is being fired must not substantially Penetrate or interact with the constraining layer during the process. Excessive Penetration of the glass into the constraining layer is likely to inhibit the removal of the constraining layer from the part being fired and possibly adversely affect the properties of the ceramic substrate if a large quantity of constraining material were to adhere to the final fired part. When selecting a glass composition for the dielectric, two general requirements should be considered. First, the glass in the dielectric substrate should meet the requirements of the dielectric (i.e., dielectric constant, hermeticity, sinterability, etc.) and second, the composition of the glass should be such as to inhibit glass Penetration into the constraining layer. Penetration inhibition is controlled in part by adjusting variables such as glass viscosity, wetting angle, etc. as will be discussed below.

An analysis of the flow of a liquid into porous media can be used to examine the glass Penetration phenomena and give insight into the process. The analysis can be used as a guideline in selecting both glass composition and constraining layer composition in conjunction with the glass requirements specified for the dielectric as discussed above. In the following analysis, the porous medium is the constraining layer and the liquid is the glass in the ceramic being fired.

The analysis was developed based on Darcy's Law to predict the Penetration of viscous fluids into porous beds and particularly within the context of the invention, the rate of Penetration dl/dt of inorganic binder into the constraining layer defined by:

$$\frac{dl}{dt} = \frac{D\Delta P}{\eta_L l} \quad (2)$$

where D is the permeability of the porous medium, $\Delta P$ is the driving pressure for Penetration, l is the length of Penetration of the liquid into the medium at time t, and $\eta L$ is the viscosity of the liquid.

Equation (2) is valid if we assume the gradiant of pressure with respect to the Penetration direction, $\nabla P$, is closely approximated by the change in pressure over the Penetration distance, or $$\frac{\Delta P}{l}.$$

Taking into consideration the radius, r, of the pore channels in the porous medium, Kozeny and Carmen show in A.E. Scheidegger, *The physics of Flow Through*

*Porous Media,* The MacMillan Co. (1960) pp 68-90, that permeability, D, can be expressed as:

$$D = r^2(1-\rho)/20 \tag{3}$$

where $\rho = \rho B/\rho T$ is the relative density of the porous media, $\rho B$ is the bulk density and $\rho T$ is the theoretical density.

$\Delta P$ is the driving pressure acting to force the liquid into the porous medium and is defined as:

$$\Delta P = \frac{2\gamma_L v \cos\theta}{r} + P_a \tag{4}$$

where $2\gamma_L v \cos\theta/r$ is the capillary pressure, $P_a$ is any external pressure difference (i.e., externally applied load), $\gamma_{Lv}$ is the liquid vapor surface energy and $\cos\theta$ is the solid liquid contact angle.

Substituting equations (3) and (4) into equation (2) and integrating the substituted equation gives:

$$l^2 = \frac{t\, r(l-\rho)\,(2\gamma_L v \cos\theta + P_a r)}{10\, \eta_L} \tag{5}$$

Since no externally applied load, $P_a$, is used in the invention, equation (5) can be expressed as:

$$l^2 = \frac{t\, r(l-\rho) 2\gamma_L v \cos\theta}{10\, \eta_L} \tag{6}$$

Figure 6:
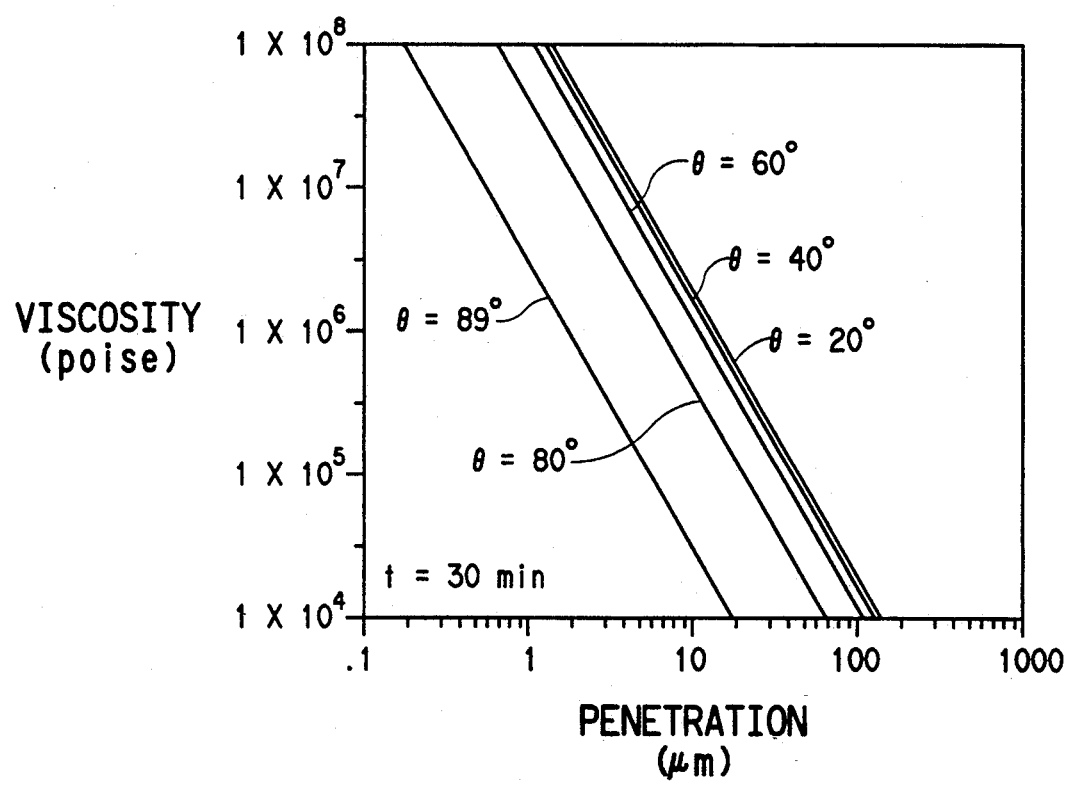
FIG. 6 is a graphical correlation of inorganic binder Penetration with binder viscosity and wetting angle.

For a given body under a constant driving pressure, the depth of Penetration is proportional to the square root of time. Several methods for deriving equation (6) are presented in the literature. In the present invention, the porous medium is the constraining layer and the viscous liquid is the glass in the substrate being fired. In practice, the viscosity of the glass, contact angle of the glass on the constraining layer material, porosity and pore radius of the constraining layer, along with time, can be adjusted to give a desired degree of Penetration. It can also be appreciated that the liquid/vapor surface energy can be modified by sintering in more or less reactive atmospheres. FIG. 6 is a plot of Penetration as a function of glass liquid viscosity ($\eta_L$) for various contact angles for $t=30$ min. Radius (r), porous layer density $(1-\rho)$ and liquid/vapor surface energy ($\gamma_{Lv}$) can also be used to influence Penetration as mentioned above.

As shown by equation (6) and by the correlation given in FIG. 6, Penetration can be predicted from the viscosity and contact angle of the inorganic binder and thus can be controlled by the adjustment of these two variables. As used herein, the term "Penetration" refers to the Penetration value of the sinterable inorganic binder component of the unfired ceramic body as determined by the above-described correlation method.

The constraining layer comprises finely divided particles of non-metallic inorganic solids dispersed in volatilizable organic medium prepared by standard ceramic tape casting methods. The low sintering rate and/or high sintering temperature of the inorganic solids in the constraining layer preserves the interconnected porosity in the layer as a pathway for volatiles and other gases to escape from both the ceramic part being fired and the constraining layer. A sintering temperature differential of at least 50° C. is adequate. The assemblage is fired at a temperature and for a time sufficient to volatilize the organic binders from both the constraining layer and the ceramic tape and to sinter the inorganic binder in the tape. Constrained sintering, wherein external pressure is applied to a ceramic body during firing via load bearing rams, cannot be achieved in conventional belt furnaces. In contrast, since external pressure is omitted in the present process, conventional firing equipment such as belt furnaces can be used. After complete sintering of the ceramic tape layers, the assemblage is cooled. The constraining layer can be subsequently removed from the surface of the finished part by a dusting or by ultrasonic treatment without affecting or damaging either the ceramic surface of the part, or the conductive pathways.

During the sintering process, following volatilization of the organic binders from the constraining layer and the ceramic body to be sintered, the constraining layer exists as a layer of inorganic powder. Application of the constraining layer in the form of a flexible tape prior to firing ensures that the loose layer of powder will be evenly distributed over the surface of the ceramic part and that the constraining layer can conform closely to the surface of the body being fired.

Ceramic Solids

Dielectric substrates typically comprise sintering (binder) and nonsintering (ceramic solid) phases. The composition of the ceramic solids in a dielectric body which can be used in the invention is not itself directly critical so long as the solids are chemically inert with respect to the other materials in the system and have the appropriate physical properties relative to the inorganic binder component of the dielectric body. The nonsintering solids are added essentially as a filler to adjust properties such as thermal expansion and dielectric constant.

The basic physical properties that are essential to the ceramic solids in the dielectric body are (1) that they have sintering temperatures above the sintering temperatures of the inorganic binder, and (2) that they do not undergo sintering during the firing step of the invention. Thus, in the context of this invention, the term "ceramic solids" refers to inorganic materials, usually oxides, which undergo essentially no sintering under the conditions of firing to which they are subjected in the practice of the invention.

Thus, subject to the above criteria, virtually any high melting inorganic solid can be used as the ceramic solids component of dielectric tape. For example, such materials as $BaTiO_3$, $CaTiO_3$, $SrTiO_3$, $PbTiO_3$, $CaZrO_3$, $BaZrO_3$, $CaSnO_3$, $BaSnO_3$, $Al_2O_3$, metal carbides such as silicon carbide, metal nitrides such as aluminum nitride, minerals such as mullite and kyanite, zirconia and various forms of silica. Even high softening point glasses can be used as the ceramic component providing they have sufficiently high softening points. Furthermore, mixtures of such materials may be used in order to match the thermal expansion characteristics of any substrate to which they are applied.

Inorganic Binder

The composition of the inorganic binder which can be used in the ceramic bodies for use in the invention is also not itself directly critical so long as it is chemically inert with respect to the other materials in the system and it has the appropriate physical properties relative to the ceramic solids in the ceramic body and the non-metallic solids in the constraining layer.

In particular, it is essential that the Penetration of the inorganic binder component of the ceramic body into the constraining layer during the firing not exceed 50 $\mu$m and preferably not exceed 25 $\mu$m. If the Penetration exceeds about 50 $\mu$m, removal of the constraining layer is likely to become difficult. Though the invention is not limited to these temperatures, firing will usually be conducted at a peak temperature of 800°–950° C. and held at least 10 minutes at the peak temperature.

The basic physical properties that are preferred for the inorganic binder in the ceramic body for use in the method of the invention are (1) that it have a sintering temperature below that of the ceramic solids in the body, (2) that it undergo viscous phase sintering at the firing temperatures used, and (3) that the wetting angle and viscosity of the inorganic binder are such that it will not penetrate appreciably into the constraining layer during firing.

The wetting characteristics of the inorganic binder, usually a glass, are determined by measuring the contact angle of the sintered inorganic binder on a smooth planar surface of the inorganic solids contained in the constraining layer. This procedure is described hereinbelow.

It has been determined that if the inorganic binder has a contact angle of at least 60°, it is sufficiently non-wetting for use in the invention. It is nevertheless preferred that the contact angle of the glass be at least 70°. In the context of the method of the invention, the higher the contact angle, the better are the release properties of the constraining layer.

When, as is usual, the inorganic binder component of the ceramic unfired tape is a glass, it may be either a crystallizing or non-crystallizing glass at the firing conditions.

The particle size and particle size distribution of the inorganic binder are likewise not narrowly critical, and the particles will usually be between 0.5 and 20 microns in size. It is, however, preferred that the 50% point of the inorganic binder, which is defined as equal parts by weight of both larger and smaller particles, be equal to or less than that of the ceramic solids. Sintering rate is related directly to the ratio of inorganic binder to ceramic solids and inversely to the glass transition temperature (Tg) and particle size of the inorganic binder.

Polymeric Binder

The organic medium in which the glass and refractory inorganic solids are dispersed is comprised of the polymeric binder, optionally having dissolved therein other materials such as plasticizers, release agents, dispersing agents, stripping agents, antifouling agents and wetting agents.

To obtain better binding efficiency, it is preferred to use at least 5% wt. polymer binder for 95% wt. ceramic solids. However, it is further preferred to use no more than 20% wt. polymer binder in 80% wt. ceramic solids. Within these limits, it is desirable to use the least possible amount of binder vis-à-vis solids in order to reduce the amount of organics which must be removed by pyrolysis and to obtain better particle packing which gives reduced shrinkage upon firing.

In the past, various polymeric materials have been employed as the binder for ceramic tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly(methyl siloxane), poly(methylphenyl siloxane), polystyrene, butadiene/styrene copolymer, polystyrene, poly(vinyl pyrrollidone), polyamides, high molecular weight polyethers, copolymers of ethylene oxide and propylene oxide, polyacrylamides, and various acrylic polymers such as sodium polyacrylate, poly(lower alkyl Q acrylates), poly(lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

More recently, Usala, in U.S. Pat. No. 4,536,535, has disclosed an organic binder which is a mixture of compatible multipolymers of 0–100% wt. $C_{1-8}$ alkyl methacrylate, 100–0% wt. $C_{1-8}$ alkyl acrylate and 0–5% wt. ethylenically unsaturated carboxylic acid of amine. Because the polymers permit the use of minimum amounts of binder and maximum amounts of dielectric solids, their use is preferred with the dielectric composition of this invention. For this reason, the disclosure of the above-referred Usala patent is incorporated by reference herein.

Frequently, the polymeric binder will also contain a small amount, relative to the binder polymer, of a plasticizer which serves to lower the glass transition temperature (Tg) of the binder polymer. The choice of plasticizers is, of course, determined primarily by the polymer which must be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthalate is most frequently used in acrylic polymer systems because it can be used effectively in relatively small concentrations.

Tape Manufacture

Unfired tapes are prepared by casting a slurry of the dielectric particles and inorganic binder dispersed in a solution of binder polymer, plasticizer and solvent onto a carrier such as polypropylene, Mylar ® polyester film or stainless steel and then adjusting the thickness of the cast film by passing the cast slurry under a doctor blade. Thus, tapes which are used in the invention can be made by such conventional methods, which are described in greater detail in U.S. 4,536,535 to Usala.

It will be understood that the unfired tapes used in the method of the invention will frequently contain vias for electrical interconnection of layers, registration holes and other perforations to accommodate devices and chip attachment. It has nevertheless been found that the method remains effective to reduce X-Y shrinkage even when the tape does contain such perforations.

In some instances, the tape may contain fillers such as ceramic fibers to provide special properties such as thermal conductivity or tensile strength to the fired tape. Though the invention was developed and is described above primarily in the context of firing ceramic bodies made from layers of ceramic tape, it will be realized that the invention can also be used to reduce X-Y shrinkage during firing of odd-shaped nonplanar articles such as cast or molded ceramic parts.

Constraining Layer

The constraining layer for use in the method of the invention is comprised of non-metallic particles dispersed in a solid organic polymer binder. As mentioned above, it is preferred that the non-metallic particles in the constraining layer have a lower sintering rate than the inorganic binder of the substrate being fired at the firing conditions and that the wetting angle of the inorganic binder on the constraining material and the viscosity of the inorganic binder be such that binder Penetration into the constraining layer is within the bounds stated previously. Thus, the composition of the inorganic solids component of the constraining layer is likewise not critical as long as the above-mentioned criteria are met. Any non-metallic inorganic material can be used as long as it does not undergo sintering during firing and as long as the wetting angle of the inorganic binder in the ceramic body (part) being fired on the constraining tape and the viscosity of the inorganic binder in the ceramic body are within the preferred bounds of inorganic binder Penetration into the constraining layer as the inorganic binder undergoes sintering during the firing process. Although the inorganic non-metallic solids used in the constraining layer may be the same as those used in the ceramic body mullite, quartz, $Al_2O_3$, $CeO_2$, $SnO_2$, MgO, $ZrO_2$, BN and mixtures thereof are preferred. However, glassy materials can be used provided their softening points are sufficiently high so that they do not undergo sintering when they are fired in accordance with the invention.

The constraining layer can be applied in the form of a flexible tape, a thick film paste, spray, dip, roll, etc. Regardless of the form in which the layer is applied, it is essential that the layer be flexible in order to attain close conformance to the ceramic body surface to reduce and preferably minimize, the size of any gaps (flaws) at the constraining layer/ceramic body interface and increase the critical stress value at the interface. In general, the same binder polymers which are suitable for the unfired ceramic tape will be suitable for the constraining layer when it is applied as a tape.

As used herein, the terms "thick film" and "thick film paste" refer to dispersions of finely divided solids in an organic medium, which dispersions are of paste consistency and have a rheology which makes them capable of being applied by conventional screen printing. Other dispersions having a consistency and rheology suitable for spray; dip or roll-coating may also be used. The organic media for such pastes are ordinarily comprised of liquid binder polymer and various rheological agents dissolved in a solvent, all of which are completely pyrolyzable during the firing process. Such pastes can be either resistive or conductive and, in some instances, may even be dielectric in character. Such compositions may or may not contain an inorganic binder, depending upon whether or not the functional solids are sintered during firing. Conventional organic media of the type used in thick film pastes are also suitable for the constraining layer. A more detailed discussion of suitable organic media materials can be found in U.S. 4,536,535 to Usala.

To ensure the formation of interconnected porosity in the constraining layer in order to provide an escape pathway for polymer decomposition products, the pore escape channels (void or pore structure) between the individual particles within the constraining layer must be sufficient in size and remain open during heatup. For the pore channels to remain open during heatup, the sintering rate of the constraining layer material must be less than the sintering rate of the ceramic part being fired as previously discussed. The pore structure in the constraining layer is determined by the characteristic particle arrangement or assembly within the layer. The arrangement or packing of particles in the layer is influenced by several factors including: the volume fraction of solids, the solids particle size, size distribution, and shape, the degree of dispersion of the particles in the initial casting, the drying characteristics of the casting, whether the layer is applied by dip or spray slurrying, and how the layer is applied. Furthermore, the pore or void structure in a tape, spray, or dip layer that contains a polymer matrix will most likely be different in the layer after the polymer is pyrolyzed. Keeping the foregoing conditions in mind, it is possible to pack particles to a bulk density of ~90 vol % solids. On the other hand, a lower limit on bulk density of ~10 vol % solids should be practicable to provide sufficiently large pore channels without serious degradation of the X-Y compressive stress capability of the layer and without significant Penetration of the glass into the layer.

Process Variables

An essential characteristic of the method of the invention is that the constraining layer conform closely to the surface of the substrate. Where the constraining layer is applied as a flexible sheet, close conformance can be achieved by laminating the sheet to the unfired dielectric tape package.

The firing cycle for the method of the invention is subject to the physical characteristics of the solids contained in both the ceramic body and the constraining layer and is further limited by the heating rate capability of the oven or kiln in which the materials are fired. A typical batch furnace firing cycle which can be used for many applications is to heat the assemblage at the rate of 3° C. per minute to 600° C., then 5° C. per minute to a peak temperature of 850° C., maintaining the assemblage at peak temperature for 30 minutes, and then cooling the assemblage by turning off the furnace. In a typical commercial installation, the firing characteristics of the materials are chosen so that they are suitable for the performance characteristics of the available furnace or kiln. Firing can, of course, be conducted in either a batch, intermittent or continuous fashion.

Upon completion of firing, the constraining layer is in the form of a dry, porous layer in which the particles are held together only weakly by van der Waals forces since during firing the organic binder volatilizes and the particles within the layer have not sintered. Because the layer has little integral strength, it can be easily removed by brushing. The removal of the fired constraining layer is nevertheless characterized by the need for very little mechanical energy, and certainly grinding is not required as it is for the prior art processes in which hot pressing is used.

Figure 3:
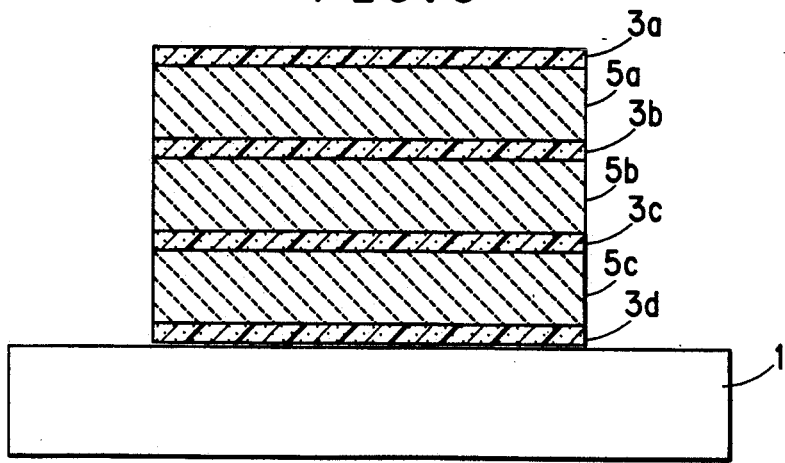
FIG. 3 is a schematic representation of the arrangement of the various components of the invention prior to firing in which multiple ceramic parts are assembled into a monolith wherein each part has a constraining layer adhered to opposite sides.

The invention is frequently used to make more complex multilayer parts in which one or more of the dielectric layers has printed thereon a thick film electrically functional pattern such as a resistor or conductive lines or both. When this is the case, the dielectric and electrically functional layers can be fired sequentially or they can be co-fired. Moreover, multiple parts can be stacked vertically in a single monolith and cofired. In such a monolith, a constraining layer lies between each part and on the top and bottom of the monolith, such that each part has a constraining layer in close conformance to the top and bottom ceramic surface as shown in FIG. 3. Whether firing a single multilayer part or multiple multilayer parts assembled into a monolith, the firing temperature profile and/or the components of the dielectric layers and electrically functional layers must be selected in such manner that the organic media of all the layers are completely volatilized and the inorganic binders of the respective layers are well sintered. In some instances, it may be necessary that the conductive phase of the thick film metallization be sintered as well. The selection of components having these relative properties is, of course, well within the skill of the thick film art.

The invention also permits the firing of multilayer parts comprising multiple dielectric tape layers and thick film conductive pastes on a rigid prefired ceramic substrate. The layers of these parts can be cofired in one step or fired sequentially, as discussed above, while maintaining excellent X-Y dimensional stability in the dielectric layers.

The ability to cofire multiple layers of dielectric tape on a rigid substrate is attractive for several reasons. The rigid substrate if made of a high strength material, such as alumina, provides a mechanical support. The rigid substrate if made of a high thermal conductivity material, such as AlN or beryllia, provides a method for removing heat from an electronic package. Rigid substrates made of other materials, such as Si or other dielectric materials, are also potentially attractive. Being able to cofire multiple layers also reduces cost by reducing the number of firing steps.

The ability to cofire dielectric tape onto a rigid substrate has advantages over other tape on substrate methods (TOS) since the multilayer dielectric tape portion of the package can be formed by conventional methods. The dielectric layers are cut, printed with conductors or other dielectric materials, vias filled, layers stacked and laminated by conventional multilayer methodology. The constraining layer is then applied to the surface of the unfired dielectric tape. When using the constraining layer in a tape form, which is the preferred method, the constraining layer tape is laminated to the exposed surface of the unfired dielectric tape such that intimate contact and close conformance is achieved between the dielectric tape and constraining layer. The dielectric tape, rigid substrate, and constraining layer tape can either be laminated together in one co-laminating step or laminated sequentially. For sequential lamination the dielectric tape layers are first laminated to the rigid substrate and then the constraining layer tape is laminated to the previously laminated rigid substrate/dielectric tape laminate. For colamination, the rigid substrate, dielectric tape and constraining layer tape are laminated in one step. If the constraining layer is applied in a paste or spray form, the dielectric tape and rigid substrate would first be laminated together and then the constraining layer material applied in the proper form. Other stacking and lamination methods are possible and are obvious to those skilled in the art.

After laminating, the entire rigid substrate, dielectric tape package, and constraining layer are fired in one step in accord with the process. Via filling is not an issue in this method.

For packages that are sequentially fired, the rigid substrate, dielectric tape, and constraining layer composite would be constructed and fired as described above, however, additional layers of dielectric tape would then be added and laminated to the already fired package. In this case, the previously fired rigid substrate/dielectric tape package acts as the rigid substrate onto which the dielectric tape and constraining layer material is applied to buildup additional layers of dielectric tape.

Thermally conductive rigid substrates and high strength rigid substrates are very attractive for hybrid applications. An attractive configuration for high power IC chip applications, is to put a cavity in the dielectric tape, cofire the cavity configuration onto a rigid AlN substrate in accord with the invention and then mount an integrated circuit chip in the cavity directly on AlN. A lid would then be attached over the cavity to provide hermeticity. The rigid AlN substrate provides a mechanical support and acts to remove heat from the package. The concept of providing cavities or walls of dielectric material into which chips are mounted is attractive because it increases the level of package integration.

The ability to cofire layers of dielectric tape on a rigid substrate is limited by the thermal expansion mismatch between the rigid substrate, dielectric tape, and constraining layer material. If the thermal expansion mismatch between the materials of the laminated composite is large, defects at the interface between the materials can occur during heating which can lead to buckling. Also, for hybrid applications, the method requires that at least one side of the rigid substrate be flat (planar), so that the tape layers can be attached to the planar surface.

Detailed Description of the Assembly FIGURES

Figure 2:
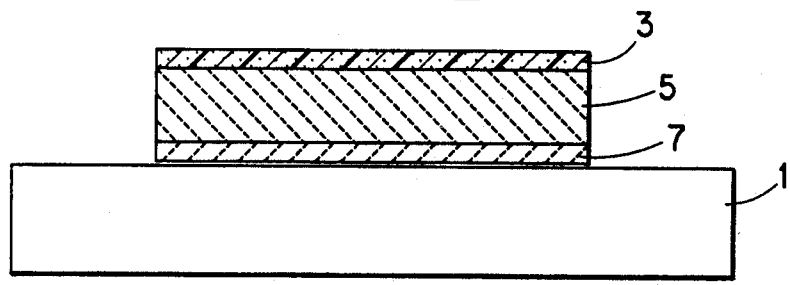
FIG. 2 is a schematic representation of the arrangement of the various components of the invention prior to firing in which a constraining layer is affixed to one side of a substrate and a rigid substrate is adhered to the opposite side of the substrate.

Three embodiments of the invention are shown in FIGS. 1-3. These embodiments are illustrative, not definitive, of assemblies of the invention.

FIG. 1 is a schematic representation of an arrangement of the components of the method of the invention in which a flexible constraining layer is affixed to both sides of a ceramic tape part.

Both sides of an unfired ceramic tape part 5 (with or without metallization) are laminated with flexible constraining layers 3 and 3a such that the constraining layers conform closely to the surface of the part. The thusly laminated ceramic part can be fired in a conventional furnace by placing the assemblage on the furnace belt 1.

FIG. 2 is a schematic representation of an arrangement of the components of the method of the invention in which a flexible constraining layer is affixed to only one side of a ceramic tape part.

A pre-fired ceramic substrate 7 (with or without metallization) and an unfired ceramic tape part (with or without metallization) 5 are aligned and colaminated. A flexible constraining layer 3 may be separately laminated to the exposed surface of ceramic tape part 5, or all three components, i.e., the constraining layer 3, the tape part 5 and the pre-fired substrate 7 may be colaminated. The assemblage is then fired in a conventional furnace by placing the assemblage on furnace belt 1.

FIG. 3 is a schematic representation of an arrangement of the various components of the invention in which multiple (n) ceramic parts are alternated with n+1 constraining layers to form a monolith. In this figure, n is three. But, n can be any positive integer.

Unfired ceramic tape parts (with or without metallization) 5a, 5b and 5c are aligned alternatively with flexible constraining layers 3a, 3b, 3c and 3d. The entire assemblage can be colaminated or subassemblies can be laminated to form the entire assembly. For example, ceramic tape part 5a and constraining layer 3a can be laminated. Constraining layer 3b and the other layers of the assemblage can then be laminated in turn to the subassembly. Alternatively, a subassembly such as ceramic tape part 5a and constraining layer 3a and 3b can be aligned and laminated. A second subassembly such as ceramic tape part 5b and 5c and constraining layer 3c and 3d can be aligned and laminated. Then, the first subassembly and the second subassembly can be aligned and laminated. After lamination, the assemblage or monolith is fired in a conventional furnace by placing the monolith on furnace belt 1.

Examples 1-9

The following set of experiments was conducted to show that the method of the invention eliminates radial shrinkage (i.e. X-Y shrinkage) during firing and provides a means for fabricating multilayer packages with tight dimensional tolerances. The examples show the precise linear dimensional control provided by the process. Samples measured in the study were prepared from Du Pont Green Tape TM (dielectric constant ~6). The technique used to measure linear dimension changes during firing is also reviewed.

Samples were prepared by standard multilayer Du Pont Green Tape TM processing techniques which included cutting blank layers of dielectric tape and laminating the layers under low temperature (e.g. 70° C.) and pressure (e.g. 3000 psi) to produce a monolithic unfired multilayer body. In some instances, as indicated below, metal conductor pastes were screen printed onto the tape layers prior to lamination. In some instances, layers of constraining tape were added to the top and bottom of the multilayer stack prior to lamination. In other instances, the dielectric layers were first laminated without constraining layers. In these instances, the constraining layers were simply added to the top and bottom of the laminated dielectric layers, and the entire stack was laminated an additional time to adhere the constraining layers.

The 2"×2" samples of Examples 1 through 5 in Table 1, were made from eight 3"×3" planar blanks. For those samples where metallization is indicated, either two or six of the eight layers were screen printed with Du Pont 6142 Ag conductor metallization, in a crosshatched test pattern. The test pattern was designed to replicate a high density conductor pattern. In Example 5, the metal was applied to only half the surface of each printed layer. Four layers of 3 mils thick constraining tape were added to both the top and the bottom of each stack, for an overall total of 16 layers of tape. All 16 layers were laminated together at 3000 psi and 70° C. for 10 minutes. The samples were then cut to the 2"×2" size. The unfired constraining layer tape/circuit parts were placed on smooth, nonporous alumina setters and burned out at 275° C. for 1 hour. Without removing them from the setters, the parts were then passed through a belt furnace and sintered at 850° C. After cooling, the constraining layers were removed by dusting.

The 5"×5" samples of Examples 6 through 9 in Table 1, were made from eight 5"×5" planar dielectric blanks. In Examples 6 and 7, three layers of constraining tape were added to both the top and bottom of the stack prior to lamination. The 14 layers of tape were then laminated at the indicated pressures, at 70° C. for 10 minutes. For Examples 8 and 9, the eight dielectric layers were first laminated alone, at 3000 psi and 1000 psi respectively, at 70° C. for 5 minutes. Three layers of constraining tape were then added to both the top and bottom of each, and the 14 layered tape parts were laminated a second time, for an additional 5 minutes, at 70° C. and 3000 psi.

In order to precisely and accurately measure linear dimensional changes during firing, which are in accord with the tolerances required in multilayer packages, a photolithographic process was used to place a relatively high resolution pattern of 25 to 28 Au crosses with 1 mil line widths on the surface of the blanked dielectric tape layers in a simple matrix. The dielectric layers so marked became the top dielectric layers of each of the test parts. The matrix of crosses was examined by an automated traveling optical microscope before and after firing. The locations of the individual crosses within the matrix were digitized and recorded in computer memory. Using the computer to drive a precision X-Y table, the matrix was imaged and the linear distances between individual crosses anywhere on the surface of a sample were calculated to an accuracy of $+/-0.2$ mil. A total of 300 to 378 linear dimension changes were measured for each of the nine sample configurations listed in Table 1.

Table 1 shows mean linear dimension changes, $\Delta l/l_0$, where $\Delta l$ is the change in linear distance between two selected crosshatches as a result of firing and $l_0$ is the initial linear distance between them. "Alternated" refers to the orientation of the individual tape layers within the sample. During doctor blade casting, particles have a tendency to align themselves in the machine casting direction which has been shown to affect shrinkage during firing. Thus it is often desirable to alternate the casting direction of the individual tape layers to minimize casting effects.

TABLE 1

| Ex. No. | Sample Configuration | Shrinkage ($\Delta l/l_0$) | Std. Dev. |
|---|---|---|---|
| 1 | 2" × 2", 8 layers, alternated, no metal | 0.001304 | 0.000291 |
| 2 | 2" × 2", 8 layers, not alternated, no metal | 0.001404 | 0.000245 |
| 3 | 2" × 2", 8 layers, alternated, two layers of metal | 0.000285 | 0.000401 |
| 4 | 2" × 2", 8 layers, alternated, six layers of metal | −0.00017 | 0.000581 |
| 5 | 2" × 2", 8 layers, alternated, six layers half metallized | −0.00015 | 0.000647 |
| 6 | 5" × 5", 8 layers, not alternated, no metal, 3000 psi lamination | 0.002000 | 0.000265 |
| 7 | 5" × 5", 8 layers, not alternated, no metal, 2000 psi lamination | 0.002546 | 0.000360 |
| 8 | 5" × 5", 8 layers, not alternated, no metal, 2 stage lamination, dielectric layers at 3000 psi, with constraining layers at 3000 psi | 0.000865 | 0.000337 |
| 9 | 5" × 5", 8 layers, not alternated, no metal, 2 stage lamination, dielectric layers at 1000 psi, with constraining layers at 3000 psi | 0.001067 | 0.000413 |

The slight dimensional changes measured for these parts is largely due to a material thermal expansion effect and a constraining layer compaction effect and is not attributed to sintering. The results show that shrinkage during firing for a number of sample configurations is virtually eliminated and that linear dimensions can be controlled to a degree of accuracy previously unattainable. The results also show that sample geometry and metallization density do not affect shrinkage behavior. For comparison, typical free sintered (i.e. not constrained) multilayer Du Pont Green Tape ™ parts have a ($\Delta l/l_o$) of 0.12 and a standard deviation of +0.002 where shrinkage is highly influenced by part geometry and conductor metal density. Since the process offers such tight dimension tolerance during processing, dimensional control is not an important issue when fabricating multilayer parts by this technique.

We claim:

1. A method for reducing X-Y shrinkage during firing of a ceramic body comprising the sequential steps of
   a. providing an unfired ceramic body comprising an admixture of finely divided particles of ceramic solids and sinterable inorganic binder dispersed in a voltalizable solid polymeric binder;
   b. applying to a surface of the unfired ceramic body a flexible constraining layer such that the constraining layer conforms closely to the unfired ceramic body to form an assemblage, the constraining layer comprising finely divided particles of non-metallic inorganic solids dispersed in a voltilizable polymeric binder, penetration of the sinterable inorganic binder of the ceramic body into the constraining layer being no more than 50 μm whereby said constraining layer is applied such that X-Y shrinkage upon firing of the ceramic body is reduced;
   c. firing the assemblage at a temperature and for a time sufficient to effect volatilization of the polymeric binders from both the ceramic body and the constraining layer, forming interconnected porosity in the constraining layer and sintering of the inorganic binder in the ceramic body;
   d. cooling the fired assemblage; and
   e. removing the constraining layer having interconnected porosity from the surface of the sintered ceramic body.

2. The method of claim 1 in which the inorganic binder is an amorphous crystallizable glass.

3. The method of claim 1 in which the inorganic binder is an amorphous vitreous glass.

4. The method of claim 1 in which the inorganic binder is an amorphous crystallizable glass.

5. The method of claim 1 in which the viscosity of the sinterable inorganic binder is at least $1 \times 10^5$ poise.

6. The method of claim 1 in which the the fired constraining layer has an interconnected pore volume of at least 10% of a total volume of the fired constraining layer.

7. The method of claim 1 in which a sintering temperature of the non-metallic inorganic solids in the constraining layer is at least 50° C. higher than a sintering temperature of the inorganic binder in the ceramic body.

8. The method of claim 7 in which the sintering temperature of the inorganic binder in the ceramic body is 600°–900° C.

9. The method of claim 1 in which the nonmetallic inorganic solids in the constraining layer are ceramic solids.

10. The method of claim 9 in which the ceramic solids in the constraining layer are selected from the group consisting of mullite, quartz, $Al_2O_3$, $CeO_2$, $SnO_2$, MgO, $ZrO_2$, BN and mixtures thereof.

11. The method of claim 9 in which the ceramic solids in both the ceramic body and the constraining layer are the same material.

12. The method of claim 1 in which the constraining layer is laminated to the unfired ceramic body.

13. The method of claim 12 in which the ceramic body comprises one or more layers of unfired ceramic tape.

14. The method of claim 13 in which the ceramic solids in the unfired ceramic tape are selected from the group consisting of $Al_2O_3$, $SiO_2$, and mixtures and precursors thereof.

15. The method of claim 13 in which the ceramic solids and inorganic binder contents of the unfired ceramic tape constitute 30–70% by volume of the unfired ceramic tape and the non-metallic inorganic solids content of the constraining layer constitutes 10–90% by volume of the fired constraining layer.

16. The method of claim 13 in which an average particle size of the solids in the unfired ceramic tape and constraining layer is 1–20 microns with less than 30% by volume of such particles having a particle size less than 1 micron.

17. The method of claim 13 in which unfired ceramic tape is laminated to a pre-fired planar ceramic substrate prior to firing.

18. The method of claim 17 in which unfired ceramic tape is laminated to both sides of the planar ceramic substrate.

19. The method of claim 17 or 18 in which at least one surface of the substrate contains a conductive pattern.

20. The method of claim 19 in which the prefired planar ceramic substrate comprises a material selected from the group consisting of $Al_2O_3$, AlN, and Si.

21. The method of claim 13 in which a thick film conductive pattern is applied to the fired tape after removal of the constraining layer and the pattern is fired to effect volatilization of the organic medium therefrom and sintering of the conductive solids therein.

22. The method of claim 21 in which the conductive material in the pattern is a noble metal or mixture or alloy thereof.

23. The method of claim 22 in which the noble metal is gold, silver, palladium or alloys thereof.

24. The method of claim 21 in which conductive material in the pattern is copper or a precursor thereof.

25. The method of claim 13 in which at least one layer of unfired ceramic tape has printed thereon an unfired pattern of thick film electrically functional paste and the assemblage is co-fired.

26. The method of claim 25 in which the thick film electrically functional paste is a conductor.

27. The method of claim 25 in which the thick film electrically functional paste is a resistor.

28. A method for reducing X-Y shrinkage during firing of a ceramic body comprising the sequential steps of:
   a. providing a monolith comprising n unfired ceramic bodies alternated with n+1 flexible constraining layers wherein n is a positive integer, each unfired ceramic body comprising one or more layers of ceramic tape comprising an admixture of finely divided particles of ceramic solids and sinterable inorganic binder dispersed in a volatizable solid polymeric binder, each constraining layer comprising finely divided particles of non-metallic inorganic solids dispersed in a volatilizable polymeric binder, and each constraining layer conforming closely to a surface of each adjacent ceramic body, penetration of the sinterable inorganic binder of the ceramic body into the constraining layer being no more than 50 μm;
b. firing the monolith at a temperature and for a time sufficient to effect volatilization of the polymeric binders from the ceramic body or bodies and the constraining layers, form interconnected porosity in the constraining layers and sinter the inorganic binder in the ceramic body or bodies;
c. cooling the fired monolith, and
d. removing the constraining layers having interconnected priority from the surfaces of the sintered ceramic body or bodies.

* * * * *